(12) United States Patent
Hurtado-Huyssen

(10) Patent No.: US 9,767,809 B2
(45) Date of Patent: Sep. 19, 2017

(54) METHOD AND COMPRESSOR FOR COMPRESSING AUDIO DYNAMICS

(71) Applicant: Antoine-Victor Hurtado-Huyssen, Paris (FR)

(72) Inventor: Antoine-Victor Hurtado-Huyssen, Paris (FR)

( * ) Notice: Subject to any disclaimer, the term of this patent is extended or adjusted under 35 U.S.C. 154(b) by 0 days.

(21) Appl. No.: 14/700,322

(22) Filed: Apr. 30, 2015

(65) Prior Publication Data

US 2015/0317982 A1    Nov. 5, 2015

(30) Foreign Application Priority Data

May 2, 2014   (FR) .................................... 14 54022

(51) Int. Cl.
*G10L 21/0316*   (2013.01)
*G10L 19/005*   (2013.01)
*H03G 7/00*   (2006.01)

(52) U.S. Cl.
CPC ........... *G10L 19/005* (2013.01); *H03G 7/002* (2013.01); *H03G 7/007* (2013.01)

(58) Field of Classification Search
CPC .......... H03G 7/002; H03G 9/025; H03G 3/00; H03G 3/3005; H03G 3/20; H03G 9/005; H03G 3/001; H03G 5/165; H03G 5/025; H04R 25/356; H04R 5/04
USPC .......... 704/225, 500–501, 503, 270; 700/94; 348/231.4; 330/254, 278, 127–132
See application file for complete search history.

(56) References Cited

U.S. PATENT DOCUMENTS

| 4,644,292 A * | 2/1987 | Kunugi .................... H03G 5/18 330/149 |
| 4,864,246 A * | 9/1989 | Kato ........................ H03G 3/32 330/129 |
| 6,675,125 B2 * | 1/2004 | Bizjak .................. H03G 3/3089 333/14 |
| 2004/0247136 A1 * | 12/2004 | Wallace ................. H04R 3/007 381/56 |
| 2006/0158246 A1 * | 7/2006 | Lee .......................... H03F 1/26 330/10 |
| 2014/0297273 A1 * | 10/2014 | Suzuki ............... G10L 21/0316 704/225 |

* cited by examiner

*Primary Examiner* — Marivelisse Santiago Cordero
*Assistant Examiner* — Stephen Brinich
(74) *Attorney, Agent, or Firm* — Sughrue Mion, PLLC

(57) ABSTRACT

A method of compressing the audio dynamics of an audio signal. The method includes a step of acquiring an audio signal; a step of selecting a first instant of the audio signal; a step of calculating a plurality of partial gains corresponding, respectively, to a plurality of observation windows of the audio signal that are centered on the first instant, the width of the observation windows following a geometric progression with a rate and first term that are predefined; a step of summing the partial gains calculated in a first corrective term; and a step of applying the first corrective term to the audio signal at the first instant.

12 Claims, 2 Drawing Sheets

METHOD AND COMPRESSOR FOR COMPRESSING AUDIO DYNAMICS

CROSS REFERENCE TO RELATED APPLICATIONS

This application claims priority based on French Patent Application No. 14 54022 filed May 2, 2014, the contents of which is incorporated herein by reference in its entirety.

The present invention generally relates to methods and systems for processing an audio signal, and particularly to methods and systems for compressing the audio dynamics of an audio signal.

The compression of the dynamics of an audio signal, commonly known by the abbreviation DRC for "Dynamic Range Compression," designates the compression of the span or range, or difference (measured in decibels) between the strongest amplitude and the weakest amplitude of an audio program.

Indeed, an audio compressor is configured to reduce the dynamics, or in other words, the sound intensity range, of an audio signal over time. To do this, the audio compressor attenuates strong sounds (peaks or crests of the signal), or alternatively enhances the weak sounds of the audio signal. The result is that the difference between the strong sound levels and the weak sound levels of the audio signal is reduced.

The compression of audio dynamics can result in
protecting the transmitter and/or listener from sound intensities that are too high, generally disagreeable or even destructive, by attenuating them;
smoothing the irregularities of a sound in order to make it more homogeneous in volume;
transforming a sound signal (mixing, musical or cinematographic mastering) in order to be listened to under particular conditions: home, automobile, airplane.

In practice, dynamic range compression generally consists of applying a gain (or correction) curve to it. This makes an audio compressor a variable gain amplifier, the gain of which is dynamically adjusted in accordance with the instantaneous power level of the input signal around a certain nominal level.

In particular, this gain curve, the calculation method of which characterizes the audio compressor, plays a decisive role in the quality of the audio signal, the dynamics of which are compressed.

Indeed, applying an inappropriate gain (particularly with an excessively high compression rate) can distort the sound of the audio signal, and even saturate it. Moreover, sharp variations in the gain curve can produce abrupt disagreeable compressions.

An object of the present invention is to propose a gain curve making it possible to achieve the best possible smoothing of the sound volume variations caused by compression.

Another object of the present invention is to limit the pumping effects caused by existing compression methods.

Another object of the present invention is to propose an audio compressor and a method of compression of an audio signal that enable a better preservation of the dynamic sensation.

To those ends, according to a first aspect, the invention relates to a method of compressing the audio dynamics of an audio signal, said method comprising,
a step of acquiring an audio signal;
a step of selecting a first instant of the audio signal;
a step of calculating a plurality of partial gains corresponding, respectively, to a plurality of observation windows of the audio signal that are centered on said first instant, the width of said observation windows following a geometric progression with a rate and first term that are predefined;
a step of summing the partial gains calculated in a first corrective term;
a step of applying the first corrective term to the audio signal at said first instant.

The method further comprises, according to various embodiments, the following steps, which may be combined:
a step of selecting a second instant of the audio signal, the duration between the first instant and the second instant being substantially equal to the integration time of the human ear;
a step of calculating a plurality of partial gains corresponding, respectively, to a plurality of observation windows of the audio signal centered on said second instant, the width of said observation windows following said geometric progression;
a step of summing the partial gains calculated in a second corrective term;
a step of applying the second corrective term to the audio signal at said second instant;
a step of calculating a variable gain ranging linearly from said first corrective term to said second corrective term;
a step of applying said variable gain to the audio signal over the period of time between said first instant and said second instant.

In this method, the partial gain is calculated as follows:

$$G_{i,n} = (L_0 - L_{i,n}) \frac{R_n - 1}{R_n}$$

where
$G_{i,n}$ is the partial gain at an instant $t_i$ and at an observation window of order n of said geometric progression, $t_i$ being said first or said second instant;
$L_{i,n}$ is the level in decibels of the average energy of the audio signal in said observation window;
$L_0$ is the nominal level in decibels of the audio signal; and
$R_n$ is a predefined compression rate to be applied to the observation window of order n.

The observation window is defined by the temporal window $[t_{i-2}{}^{n-1}, t_{i-2}{}^{n+1}[$ centered on the instant $t_i$, $t_i$ being the first instant or the second instant, so that the rate and the first term of said geometric progression are, respectively, equal to two and to the period of time between said first instant and said second instant.

According to a second aspect, the invention relates to an audio compressor for compressing the audio dynamics of an audio signal, said audio compressor comprising
means for acquiring an audio signal;
means configured to select a first instant of the audio signal;
means for calculating a plurality of partial gains corresponding, respectively, to a plurality of observation windows of the audio signal that are centered on said first instant, the width of said observation windows following a geometric progression with a rate and first term that are predefined;
means for summing the partial gains calculated in a first corrective term;

means for applying the first corrective term to the audio signal at said first instant.

The aforementioned system further comprises, according to various embodiments, the following means, which may be in combination:

means for selecting a second instant of the audio signal, the period of time between the first instant and the second instant being substantially equal to the integration time of the human ear;

means for calculating a plurality of partial gains corresponding, respectively, to a plurality of observation windows of the audio signal that are centered on said second instant, the width of said observation windows following said geometric progression;

means for summing the partial gains calculated in a second corrective term;

means for applying the second corrective term to the audio signal at said second instant;

means of calculating a variable gain ranging linearly from said first corrective term to said second corrective term;

means for applying said variable gain to the audio signal over the period of time between said first instant and said second instant.

According to a third aspect, the invention relates to a computer program product implemented on a memory medium, capable of being utilized within a computer processing unit and comprising instructions for the implementation of the method summarized above.

Other objects and advantages of the invention will be seen from the description of embodiments, provided hereinafter with reference to the appended drawings in which.

Figure 1:
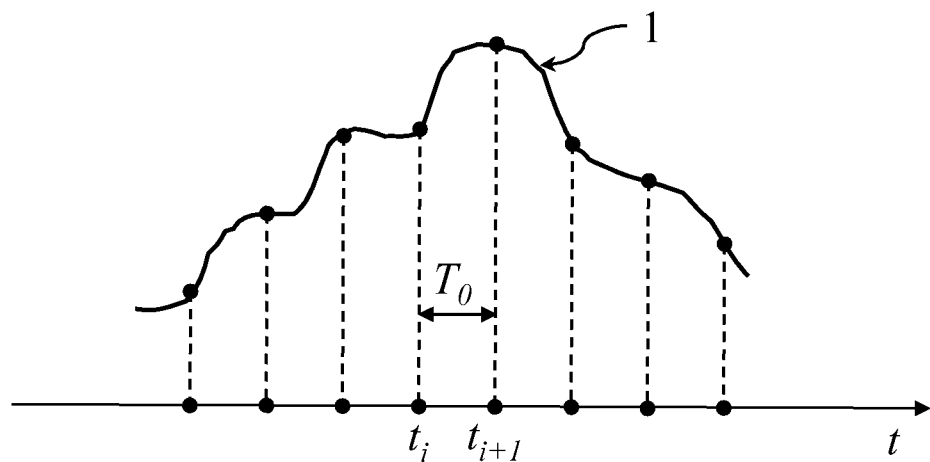
FIG. 1 illustrates an audio signal cut into regular frames.

Displayed in FIG. 1 is an audio signal 1 cut into frames of a constant duration $T_0$ (i.e., in regular time fragments or frames of a duration $T_0$).

Said frames are indexed by the instants $t_i = i \cdot T_0$. A frame of the audio signal 1 corresponds to the segment ranging from the instant $t_i$ to the instant $t_{i+1}$.

Preferably, the duration $T_0$ of a temporal frame of the audio signal 1 is on the order of the integration time of the human ear (from 10 to 100 milliseconds). In one embodiment, $T_0$ is on the order of tens of milliseconds such as 5 ms, 10 ms, 20 ms or 30 ms.

Figure 2:
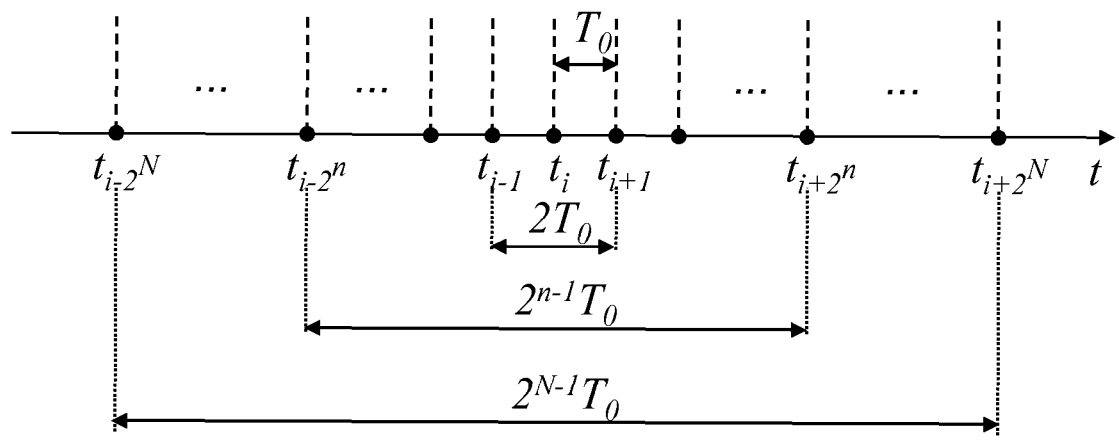
FIG. 2 illustrates observation windows of the audio signal.

With reference to FIG. 2, a corrective term $S_i$ defined as follows, is associated with each instant $t_i$:

$$S_i = \sum_{n=1}^{N} G_{i,n}$$

where $G_{i,n}$ is a partial gain corresponding to an observation window of order n around the instant $t_i$.

N is a predefined natural whole number.

In other words, the corrective term $S_i$ is obtained by the sum of a series of partial gains $G_{i,n}$ corresponding to different observation windows centered on the instant $t_i$ and of different width.

An observation window of order n around the instant $t_i$ is defined by the temporal window $[t_{i-2}^{n-1}, t_{i-2}^{n+1}[$ (see FIG. 2). In this temporal window, the partial gain $G_{i,n}$ of order n around the instant $t_i$ is defined by the following equation:

$$G_{i,n} = (L_0 - L_{i,n}) \frac{R_n - 1}{R_n}$$

where $L_{i,n}$ is the level in decibels of the average energy of the audio signal 1 in the temporal window concerned $[t_{i-2}^{n-1}, t_{i-2}^{n+1}[$;

$L_0$ is the nominal level in decibels of the audio signal 1; and $R_n$ is a predefined compression rate to apply to the observation window of order n.

The result is that, for a given temporal window $[t_{i-2}^{n-1}, t_{i-2}^{n+1}[$, the partial gain $G_{i,n}$ is a function of the difference measured between the average energy $L_{i,n}$ of the signal over the width of said window and the nominal level $L_0$ of the audio signal.

Moreover, it should be noted that the width of the observation windows $(2T_0, \ldots, 2^{n-1}T_0, \ldots, 2^{N-1}T_0)$ (see FIG. 2) follows a geometric progression up to an order N. The value of N is chosen in such a way as to best preserve the sensation of the dynamics of the audio signal. In one embodiment, N is equal to 10.

Advantageously, the use of observation windows, the width of which varies according to a geometric progression, makes it possible to limit the pumping effects and sharp variation of the compression.

Thus, the partial gains $G_{i,n}$ corresponding to N observation windows, the width of which follows a geometric progression with a rate of two and first term $T_0$, are summed to obtain the corrective term $S_i$ associated with the instant $t_i$ of the audio signal 1.

Since the calculation of the corrective terms $S_i$ uses observation windows centered on the instant $t_i$, and thus requires segments of the audio signal before and after the instant $t_i$, it is assumed that at the beginning of the audio signal ($t_i=0$), as well as at the end thereof, the audio segments thereof are equal to the nominal level $L_0$.

Figure 3:
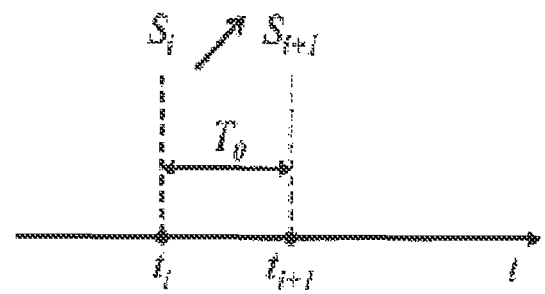
FIG. 3 illustrates a method of calculating the gain curve of an audio compressor.

A variable gain ranging linearly (see FIG. 3) from the corrective term $S_i$ (corresponding to the instant $t_i$) to the corrective term $S_{i+1}$ (corresponding to the instant $t_{i+1}$) is applied to the audio signal 1 in the temporal window $[t_i, t_{i+1}[$. The result is that, between the instants $t_i$ and $t_{i+1}$, the elemental segment of the audio signal 1 receives a gain ranging linearly from the one-time corrective term $S_i$ (corresponding to the instant $t_i$) to the corrective term $S_{i+1}$ (corresponding to the instant $t_{i+1}$).

In other words, the gain curve in decibels to apply to the audio signal in the window $[t_i, t_{i+1}[$ takes the following form:

$$S(t) = \frac{S_{i+1} - S_i}{T_0} t + \frac{t_{i+1} S_i - t_i S_{i+1}}{T_0}$$

Thus, the calculation of the corrective terms $S_i$ at the different instants $t_i$ makes it possible to obtain the gain curve to apply to the input audio signal. The resulting correction curve is piecewise linear, meaning that it changes linearity (or slope) at the instants $t_i$.

In order to reduce the differences in sound levels within the audio signal 1 around a nominal level $L_0$, said gain curve is applied to the input audio signal. The amplitude of the audio signal at a given instant t is multiplied by the value of the corrective term S(t) at said instant of the gain curve.

Thus, the audio compressor acts variably in the time t on the input audio signal depending on the sound level of the signal at each instant and the corrective term of the gain curve at said instant. For sound levels that are near the nominal level, the output value remains nearly unchanged (slope of the gain curve close to 1). Otherwise, beginning at a certain sound level, a corrective term is applied (slope of the gain curve different from 1).

Figure 4:
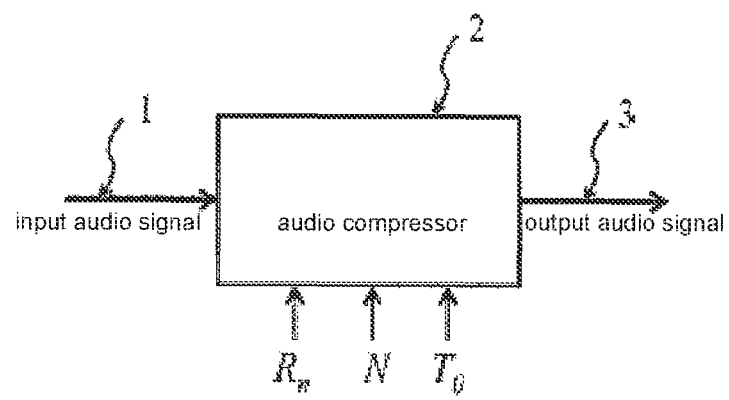
FIG. 4 illustrates an audio compressor.

With reference to FIG. 4, the audio compressor 2 uses, as data, a given compression rate $R_n$ for each window of order n, duration $T_0$ and number N of observation windows, for the compression of the dynamics of the input audio signal 1. The application of the gain curve, calculated by the audio compressor 2, to the input audio signal 1, gives in output an audio signal 3, the dynamics of which are compressed.

Advantageously, a plurality of dynamic ranges of the audio signal can be processed with different compression rates.

Advantageously, the dynamics compression method described above can be implemented in software form (as a plug-in or application, for example) or hardware in a console, an external rack or a sound processing digital workstation.

The invention claimed is:

1. A method of compressing audio dynamics of an audio signal, said method comprising:
   acquiring an audio signal;
   selecting a first instant of the audio signal;
   calculating a plurality of partial gains corresponding, respectively, to a plurality of observation windows of the audio signal that are centered on said first instant, the width of said observation windows following a geometric progression with a rate and first term that are predefined;
   summing the partial gains calculated in a first corrective term;
   generating an audio signal having compressed audio dynamics by applying the first corrective term to the audio signal at said first instant; and
   outputting the audio signal having compressed audio dynamics,
   wherein the outputting the audio signal having compressed audio dynamics protects a listener from high sound intensities in the acquired audio signal.

2. The method according to claim 1, further comprising:
   selecting a second instant of the audio signal, the duration between the first instant and the second instant being substantially equal to the integration time of the human ear;
   calculating a plurality of partial gains corresponding, respectively, to a plurality of observation windows of the audio signal centered on said second instant, the width of said observation windows following said geometric progression;
   summing the partial gains calculated in a second corrective term; and
   applying the second corrective term to the audio signal at said second instant.

3. The method according to claim 2, wherein the observation window is defined by the temporal window $[t_{i-2}^{n-1}, t_{i-2}^{n+1}[$ centered on the instant $t_i$, $t_i$ being the first instant or the second instant, so that the rate and the first term of said geometric progression are, respectively, equal to two and to the period of time between said first instant and said second instant.

4. The method according to claim 2, wherein said period of time between said first instant and said second instant is substantially equal to 10 milliseconds.

5. The method according to claim 1, further comprising:
   calculating a variable gain ranging linearly from said first corrective term to said second corrective term; and
   applying said variable gain to the audio signal over the period of time between said first instant and said second instant.

6. The method according to claim 1, wherein the partial gain is calculated as follows:

$$G_{i,n} = (L_0 - L_{i,n}) \frac{R_n - 1}{R_n}$$

where
   $G_{i,n}$ is the partial gain at an instant $t_i$ and at an observation window of order n of said geometric progression, $t_i$ being said first or said second instant;
   $L_{i,n}$ is the level in decibels of the average energy of the audio signal in said observation window;
   $L_0$ is the nominal level in decibels of the audio signal; and
   $R_n$ is a predefined compression rate to be applied to the observation window of order n.

7. A non-transitory computer readable medium storing a program causing a computer to execute a method for compressing audio dynamics of an audio signal, the method comprising:
   acquiring an audio signal;
   selecting a first instant of the audio signal;
   calculating a plurality of partial gains corresponding, respectively, to a plurality of observation windows of the audio signal that are centered on said first instant, the width of said observation windows following a geometric progression with a rate and first term that are predefined;
   summing the partial gains calculated in a first corrective term;
   generating an audio signal having compressed audio dynamics by applying the first corrective term to the audio signal at said first instant; and
   outputting the audio signal having compressed audio dynamics,
   wherein the outputting the audio signal having compressed audio dynamics protects a listener from high sound intensities in the acquired audio signal.

8. The non-transitory computer readable medium according to claim 7, further comprising:
   selecting a second instant of the audio signal, the duration between the first instant and the second instant being substantially equal to the integration time of the human ear;
   calculating a plurality of partial gains corresponding, respectively, to a plurality of observation windows of the audio signal centered on said second instant, the width of said observation windows following said geometric progression;
   summing the partial gains calculated in a second corrective term; and
   applying the second corrective term to the audio signal at said second instant.

9. The non-transitory computer readable medium according to claim 8, wherein the observation window is defined by the temporal window $[t_{i-2}^{n-1}, t_{i-2}^{n+1}[$ centered on the instant $t_i$, $t_i$ being the first instant or the second instant, so that the rate and the first term of said geometric progression are, respectively, equal to two and to the period of time between said first instant and said second instant.

10. The non-transitory computer readable medium according to claim 8, wherein said period of time between said first instant and said second instant is substantially equal to 10 milliseconds.

11. The non-transitory computer readable medium according to claim 7, further comprising:
    calculating a variable gain ranging linearly from said first corrective term to said second corrective term; and
    applying said variable gain to the audio signal over the period of time between said first instant and said second instant.

12. The non-transitory computer readable medium according to claim 7, wherein the partial gain is calculated as follows:

$$G_{i,n} = (L_0 - L_{i,n}) \frac{R_n - 1}{R_n}$$

where $G_{i,n}$ is the partial gain at an instant $t_i$ and at an observation window of order n of said geometric progression, $t_i$ being said first or said second instant;

$L_{i,n}$ is the level in decibels of the average energy of the audio signal in said observation window;

$L_0$ is the nominal level in decibels of the audio signal; and $R_n$ is a predefined compression rate to be applied to the observation window of order n.

* * * * *